United States Patent [19]
Sunter et al.

[11] Patent Number: 5,659,312
[45] Date of Patent: Aug. 19, 1997

[54] METHOD AND APPARATUS FOR TESTING DIGITAL TO ANALOG AND ANALOG TO DIGITAL CONVERTERS

[75] Inventors: Stephen K. Sunter, Napean, Canada; Naveena Nagi, Santa Clara, Calif.

[73] Assignee: LogicVision, Inc., San Jose, Calif.

[21] Appl. No.: 663,493

[22] Filed: Jun. 14, 1996

[51] Int. Cl.$^6$ .................................................. H03M 1/10
[52] U.S. Cl. ........................... 341/120; 341/144; 341/155
[58] Field of Search .................................. 341/120, 118, 341/155, 144, 110; 364/580, 579

[56] References Cited

U.S. PATENT DOCUMENTS

| | | | |
|---|---|---|---|
| 4,207,520 | 6/1980 | Flora et al. | 324/238 |
| 4,315,254 | 2/1982 | Honjyo et al. | 340/347 CC |
| 4,328,552 | 5/1982 | Stovall | 364/554 |
| 4,340,856 | 7/1982 | Orlandi | 324/73 R |
| 4,354,177 | 10/1982 | Sloane | 340/347 CC |
| 4,419,656 | 12/1983 | Sloane | 340/347 CC |
| 4,656,632 | 4/1987 | Jackson | 371/20 |
| 4,667,296 | 5/1987 | Crowe | 364/553 |
| 4,710,747 | 12/1987 | Holland | 340/347 AD |
| 4,758,781 | 7/1988 | Ueno et al. | 324/73 R |
| 4,875,048 | 10/1989 | Shimizu et al. | 341/156 |
| 4,896,282 | 1/1990 | Orwell | 364/571.05 |
| 4,947,106 | 8/1990 | Chism | 324/73.1 |
| 4,947,168 | 8/1990 | Myers | 341/120 |
| 4,969,148 | 11/1990 | Nadeau-Dostie et al. | 371/21.1 |
| 5,047,770 | 9/1991 | Engeler et al. | 341/120 |
| 5,132,685 | 7/1992 | DeWitt et al. | 341/120 |
| 5,144,225 | 9/1992 | Talbot et al. | 324/73.1 |
| 5,185,607 | 2/1993 | Lyon et al. | 341/120 |
| 5,220,519 | 6/1993 | Eller | 364/579 |
| 5,225,834 | 7/1993 | Imai et al. | 324/120 |
| 5,289,116 | 2/1994 | Kurita et al. | 324/158 R |
| 5,293,325 | 3/1994 | Roos | 364/571.01 |
| 5,349,587 | 9/1994 | Nadeau-Dostie et al. | 371/22.3 |
| 5,381,148 | 1/1995 | Mueck et al. | 341/139 |
| 5,428,357 | 6/1995 | Haab et al. | 341/55 |
| 5,431,514 | 7/1995 | Mukuda et al. | 341/120 |
| 5,493,519 | 2/1996 | Allen, III | 364/579 |

OTHER PUBLICATIONS

A. Jongepier, "Fast test method for serial A/D and D/A converters", European Test Conference, 1989, pp. 262–267.

Chen–Yang Pan et al., "Pseudo–Random Testing and Signature Analysis for Mixed–Signal Circuits", IEEE 1995, ICCAD 95, 1063–6757/95, pp. 102–107.

Chin–Long Wey, "Built–In Self–Test (BIST) Structure for Analog Circuit Fault Diagnosis", IEEE Transactions on Instrumentation and Measurement, vol. 39, No. 3, Jun. 1990, pp. 517–521.

Naveena Nagi et al., "A Signature Analyzer for Analog and Mixed–Signal Circuits", Computer Engineering Research Center, University of Texas at Austin, Austin, TX (undated), 4 pgs.

A.K. Lu et al., "An Analog Multi–Tone Signal Generator For Built–In–Self–Test Applications", International Test Conference, IEEE, 1994, 0–7803–2102–2/94, Paper 27.3, pp. 650–659.

(List continued on next page.)

*Primary Examiner*—Brian K. Young
*Attorney, Agent, or Firm*—Skjerven, Morrill, MacPherson, Franklin & Friel; Norman R. Klivans

[57] ABSTRACT

A method and apparatus suitable for built in self test (BIST) of analog-to-digital converters (ADCs) and digital-to-analog converters (DACs) embedded in a mixed-signal integrated circuit, and high precision converters. Deterministic test patterns, such as a binary count, are applied to the DAC, and via the DAC directly to the ADC or via an analog circuit to be tested in the test mode. The testing is performed digitally via the digital-analog-digital path, is compatible with conventional digital test, and requires minimal additional circuitry to implement. The output response of the ADC is accumulated into four or more signatures which individually represent a number of parameters including offset, gain, second harmonic distortion, third harmonic distortion, and differential non-linearity. Also, the four accumulated sums are used to calculate easily the coefficients of a third order polynomial which best fits a set of data points which are the digital output signals expressed as a function of the input test pattern.

23 Claims, 3 Drawing Sheets

OTHER PUBLICATIONS

S. Mir et al., "Built-in Self-Test and Fault Diagnosis of Fully Differential Analog Circuits", INPG/TIMA Laboratory, 38031 Grenoble, France, undated, 5 pgs.

Michael J. Ohletz, "Hybrid Built–In Self–Test (HBIST) for Mixed Analog/Digital Integrated Circuits", Laboratorium für Informationstechnologie, Universität Hannover, Germany, undated, pp. 307–316.

M.F. Toner et al., "A BIST Scheme for an SNR Test of a Sigma–Delta ADC", IEEE 1993, International Test Conference 1993, 0–7803–1429–8/93, Paper 37.3, pp. 805–814.

Karim Arabi et al., "A New Built–In Self–Test Approach for Digital–to–Analog and Analog–to–Digital Converters", Department of Electrical and Computer Engineering, Montréal, Québec, Canada, 1994 ACM 0–89791–690–5/94/ 0011/0491, pp. 491–494.

Eiichi Teraoka et al., "A Built–In Self–Test for ADC and DAC in a Single–Chip Speech CODEC", 1993 IEEE, International Test Conference 1993, 0–7803–1429–8/93, Paper 37.1, pp. 791–796.

METHOD AND APPARATUS FOR TESTING DIGITAL TO ANALOG AND ANALOG TO DIGITAL CONVERTERS

BACKGROUND OF INVENTION

1. Field of the Invention

This invention relates to circuit testing and more specifically to built in self testing of digital to analog and analog to digital converters.

2. Description of the Prior Art

In testing Analog to Digital Converters (ADCs), and Digital to Analog Converters. (DACs), the following well known analog signal properties are of interest:

(1) gain—the slope of the best fit straight line which approximates the transfer function;

(2) offset—the equivalent constant value added to all outputs, relative to the input;

(3) noise—the random variations in the output for any signal input, or (small) random variations in the input-output transfer function; and (4) non-linearity—the differences between the transfer function and a straight line.

In many integrated circuits (ICs), both an ADC and DAC are present, to allow digital signal processing (DSP) of analog input signals and generation of an analog result. This is often called a "mixed signal" IC. The presence of both types of converters can facilitate the use of digital-only testing of these inherently mixed analog-digital functions: a digital stimulus can be applied to the DAC, the DAC's output connected to the ADC input, and the digital output signal compared to the expected result.

The primary problem with such a digital test solution is the intolerance of most digital tests to any bit errors. Whenever analog signals are used however, noise is inevitable, and the digital output of an ADC may occasionally be in error by one or two Least Significant Bits (LSBs). This is especially true for high precision (e.g. greater than 12 bits) or high speed (e.g. greater than 100 MHz) converters. Such errors are typically quite tolerable, because low-pass filtering will take place in the DSP or in the analog domain, both for anti-aliasing and for noise reduction.

In addition, analog output signals inevitably have some DC offset, which again is typically quite tolerable, because high-pass filtering is also used. In fact, high-pass filtering is often used in anticipation of DC offset which is only one of several inherent low frequency noise sources in any system.

Gain error can also be present and should be negligible, but in many systems a small (e.g. 1%–5%) gain error can be tolerated or compensated for. Even in high accuracy analog systems, better than 0.1% gain error is rare. For a 16-bit DAC, 0.1% amounts to 32 Least Significant Bits of error, at the maximum output.

Linearity is the most difficult non-ideal behavior to correct or tolerate. Non-linearity can cause harmonic distortion and intermodulation, both of which can cause problems, or are annoying to the human ear in an audio context. Differential non-linearity is the difference, at any point on the transfer function, between the actual voltage step size and the ideal step size corresponding to one LSB. In signal processing it causes noise, but only when an AC signal is present. Integral non-linearity is the peak difference between the actual transfer function and the best fit straight line. In signal processing, integral non-linearity causes harmonic distortion, and is more easily measured using a Fast Fourier Transform (FFT).

There are known all-digital test schemes that are supposedly noise tolerant. Almost all systems achieve noise-tolerance by low-pass filtering, which is a way of integrating the noise; integration causes averaging of the noise and the primary property of noise is that its average value is zero. In an all-digital approach, accumulating the error over time is the only way to integrate. This can be done by simply adding samples, or in a Discrete Fourier Transform (DFT).

One known testing approach applies a test signal from a binary counter or linear feedback shift register (LFSR) to the DAC and sums the resulting output signal from the ADC for all possible inputs, or a known subset thereof. Since noise on average sums to zero, the ADC output sum should be independent of noise. Unfortunately systematic errors such as offset are not "noise", so even a single LSB of offset causes the output sum to change dramatically. For example, one LSB offset increases the sum by 4096 ($=2^{12}$) for a 12-bit system, masking any excessive noise or causing false rejection in testing of ICs with acceptable offset and noise. For a 12-bit DAC, with 5 volt range, an offset of only 10 mV is equivalent to 8 LSB, and so causes the sum to increase by greater than 32,000 (4096×8). Likewise a gain error will cause an error in the sum. A 1% gain error for a 12-bit system increases the sum by greater than 80,000 (0.5×1%×4096×4096). Although the acceptable range for the sum can be set accordingly, this might mask excessive noise or nonlinearity. To conclude, this method has the major drawback of providing only a composite test result, the composite being of gain, offset, noise, and linearity, and not testing for these parameters individually.

Methods have been proposed to minimize the amount of logic needed to accumulate the sum, by accumulating only the difference between the expected output and the actual output. Since the sum of the errors is ideally zero, a much smaller accumulator is needed. However, the above-mentioned fundamental flaws remain.

The typical prior art method to test ADCs and DACs in IC production is to apply a single frequency sinusoid as a test input signal, either in the analog domain or the digital equivalent. The resulting output signal is then processed using a DFT, to measure offset (0 Hz frequency component), gain (at the fundamental frequency), noise (standard deviation across all frequencies in bandwidth), and non-linearity (second and third harmonic components). This requires expensive off-chip test equipment (with an array processor) and special software. This method owes its precision to the fact that all analog samples (typically between 256 and 4096 samples) contribute to every measurement result and this extreme amount of redundancy minimizes the impact of isolated noise spikes or jitter.

SUMMARY

In accordance with this invention, analog to digital converters and digital to analog converters (for instance in a mixed-signal IC) are tested to measure individually a number of analog circuit parameters including gain, offset, noise, and others. Each parameter is tested-for individually to provide maximum IC yield from the testing. The actual test circuitry is simple so that it may economically be included on-chip for a built in self test (BIST) functionality not requiring the above-described off-chip test equipment and software.

Therefore in accordance with the invention, the signal gain of the ADC and DAC in a system (e.g. an IC) including the DAC, a linear analog network, and the ADC, is measured by integrating the digital output signal for all data points whose input digital value is less than the arithmetic mean input value (summed for all data points), and this integral is subtracted from the integral of all data points whose input digital value is greater than the mean input value, and the result of this subtraction is divided by a constant to arrive at the gain.

Integral non-linearity, which causes harmonic distortion, is calculated by integrating the output as four equal groups of data points, instead of two groups as was described above for gain. The four integrals are then used to calculate the coefficients of the second and third order terms in the polynomial which best fits the transfer function, or to calculate the magnitude of the second and third harmonics in the frequency domain.

Differential non-linearity, which causes output noise for non-DC signals, is calculated by comparing the actual error in output (with respect to the input), to the average error for other output values resulting from approximately equal input data values.

The noise is determined as a standard deviation or root mean square (RMS) of the noise of the system, where the mean digital output, for selected constant value digital or analog inputs, is determined for a sufficiently large number of data points, and then the absolute value of the difference between every subsequent digital output signal and the calculated mean digital output is summed for a sufficiently large number of samples, and the sum is divided by the number of samples and by 0.6745 (the mean deviation of a Gaussian distribution, relative to its standard deviation). The method used in the prior art is similar, except that in the prior art it is implemented using e.g. a capacitor to subtract the mean value, and the correction factor used is 0.707. (The difference is approximately 5%.) Determination of noise is included here to show that complete BIST of the analog parameters has been achieved.

Thus in accordance with the present invention, various circuit parameters normally measured in the frequency domain are separately determined, such as the four coefficients of a best fit third-order polynomial, and the levels of two types of noise: differential non-linearity and random noise.

DETAILED DESCRIPTION

Circuitry

Figure 1:
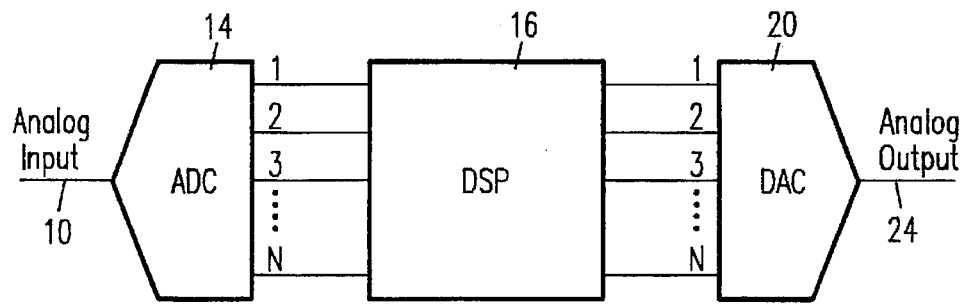
FIG. 1 shows in a block diagram the normal (operational) mode connections of e.g. an integrated circuit mixed signal processor which is to be tested.

FIG. 1 is a block diagram of portions of a mixed signal processing circuit, e.g. an integrated circuit, subject to testing in accordance with this invention. FIG. 1 shows the normal operational connections, with the analog input signal applied at terminal 10 and converted to a digital signal by ADC 14 which in turn connects, via the lines 1, 2, 3, ..., N to the e.g. digital signal processing (DSP) circuitry 16. The digital output signal from DSP circuitry 16 is applied via another set of lines 1, 2, 3, ..., N to the digital to analog converter 20 which provides on its output terminal 24 the corresponding analog output signal.

To test this circuit the connections are changed, as described in detail below, to be those shown in FIG. 2. Here the digital test input signals are applied to the input lines 1, 2, 3, ..., N to the DAC 20, the output terminal of which is connected, via the analog signal line 28, to the input terminal of ADC 14, which outputs the digital test output signals. Hence a test pattern which is a sequence of test vectors is applied as a digital test input signal to DAC 20 and the digital test output signals are output from ADC 14.

Figure 2:
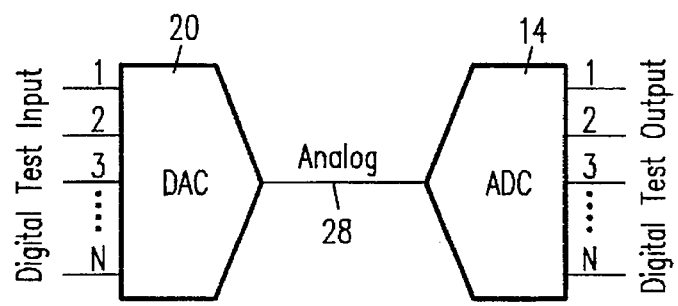
FIG. 2 shows the test mode connections for the digital to analog converter and analog to digital converter of FIG. 1.
Figure 3:
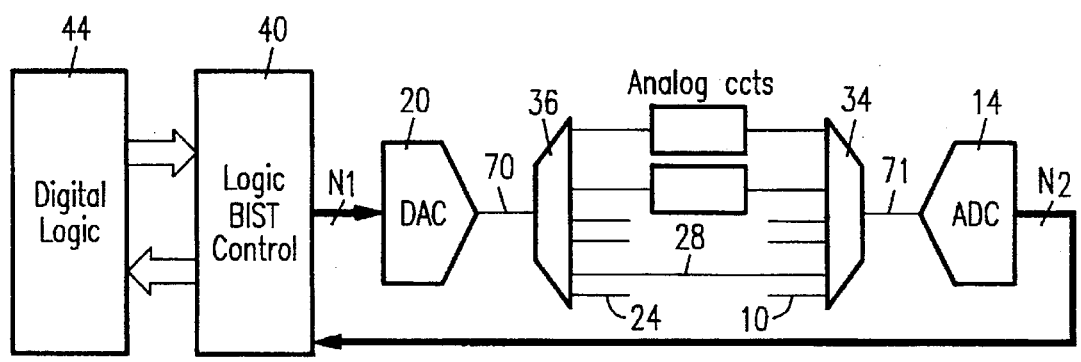
FIG. 3 shows in a block diagram elements of an integrated circuit under test in greater detail than in FIG. 2.

One exemplary implementation of the test mode connections of FIG. 2 for the circuit of FIG. 1 is shown in FIG. 3 which includes structures from both FIGS. 1 and 2.

In FIG. 3, the digital signal busses are the thick lines while the thin lines carry analog signals. Control signals are not shown for clarity. A conventional binary counter-based circuit which is part of the logic BIST controller 40, generates a test pattern which is applied to the ADC 14 via the DAC 20. The output of the DAC 20 is disabled from driving the normal analog outputs in the test mode. The ADC 14 output signal (response) is accumulated in a register and/or is compared to the input test pattern and the difference is accumulated in a register as explained below.

The analog test line 71 is connected via multiplexer 34 which selects whether the input signals to ADC 14 come from the DAC 20 or analog circuits to be tested (in test mode) or from the analog input terminal 10 (in operational mode), whereby the signal on output line 70 from DAC 20 is directed via demultiplexer 36 to ADC 14 or to any of a number of analog circuits to be tested.

Also shown in FIG. 3 is the digital logic 44, which is the portion of the IC subjected to digital logic testing. The logic built in self test (BIST) controller 40 generates test patterns and processes the output digital test signals from ADC 14, and may also do this conventionally for the digital logic 44. The DSP circuitry 16 in FIG. 1 may be included in the digital logic 44 and tested as conventional logic, or it may be tested as though it were a DAC-to-analog-circuit-to-ADC system.

Figure 4:
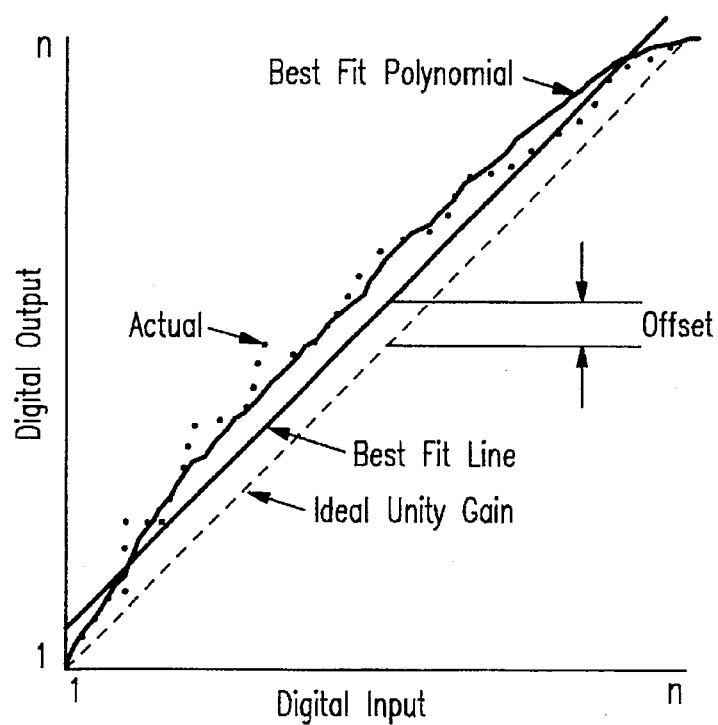
FIG. 4 shows graphically a digital output signal as a function of a digital input test signal.

The test process is described hereinafter. FIG. 4 shows graphically a digital output signal from the ADC 14 of FIG. 2 plotted against the digital input signal to DAC 20. Both the x axis and y axis are shown as values from one to n, where n is the number of test samples (data points). The dotted "actual" line is the transfer function, i.e. the digital output signal value versus the digital input signal value. The straight broken line extending at 45° from the origin (1,1) is the "ideal" transfer function, for which the digital output signal is equal to the digital input signal.

The solid best fit cured line is the calculated approximation of the transfer function described above. The curved line can be completely defined by a third order (or higher) polynomial equation:

$$y = b_0 + b_1 x + b_2 x^2 + b_3 x^3$$

If the n values of x are shifted horizontally on the x-axis to range from $-(n-1)/2$ to $+(n-1)/2$, in unit steps, then $b_0$, $b_1$, $b_2$, and $b_3$ in the above equation are approximately equal to offset, gain, second order non-linearity, and third order non-linearity, respectively. In frequency domain analysis, where x=cos 2πf, and f=frequency, then as is well known (e.g. from electronics communications text books), DC offset, gain at the fundamental frequency, the level of the second harmonic, and the level of the third harmonic are easily calculated using only the equation above and the value of n. The solid straight line in FIG. 4 is a simpler approximation of the transfer function than the polynomial: the $b_2$ and $b_3$ coefficients are assigned a value of zero.

Polynomial Analysis

The following describes mathematically calculation of the four above-described parameters of the circuit under test, i.e. the coefficients of a third order polynomial that best fits the transfer function. It is to be understood that in one embodiment this process is carried out by a computer program (software) stored in a computer-readable memory (e.g., RAM, ROM, diskette, hard disk, CD-ROM, etc.) and implemented in a computer system also including at least a processor for executing the computer program instructions, i.e. a computer-implemented system.

Figure 5:
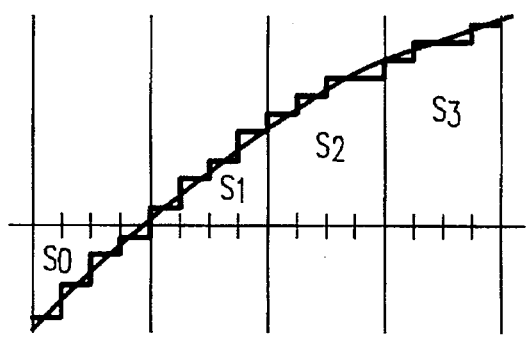
FIG. 5 shows graphically determining the transfer function using integrals.

Using the four areas $S_0$, $S_1$, $S_2$, $S_3$ between the transfer function and the x-axis in the graph of FIG. 5 where n is the number of samples and is preferably a multiple of 4, and the x-coordinates for all samples are uniformly spaced, one can determine the coefficients for the best fit, third order polynomial approximation to the actual transfer function $$y=b_0+b_1x+b_2x^2+b_3x^3$$

where x is normalized to range from $-(n-1)/2$ to $+(n-1)/2$, in unit steps.

Four values $S_0$, $S_1$, $S_2$, $S_3$ are calculated:

$$S_0 = \sum_{1}^{n/4} y_i, \quad S_1 = \sum_{(n/4)+1}^{n/2} y_i, \quad S_2 = \sum_{(n/2)+1}^{3n/4} y_i, \quad S_3 = \sum_{(3n/4)+1}^{n} y_i.$$

Then:

$$b_3 = [(S_3 - S_0) - 3 \cdot (S_2 - S_1)] \cdot \frac{128}{3n^4} \quad \left( = B_3 \frac{128}{3n^4} \right)$$

$$b_2 = [(S_3 - S_2) - (S_1 - S_0)] \cdot \frac{16}{n^3} \quad \left( = B_2 \frac{16}{n^3} \right)$$

$$b_1 = \frac{(S_3 + S_2) - (S_1 + S_0)}{\left(\frac{n}{2}\right)^2} - b_3 \frac{n^2}{8} \quad \left( = B_1 \frac{4}{n^2} - b_3 \frac{n^2}{8} \right)$$

$$b_0 = \frac{(SI3 + S_2) + (S_1 + S_0)}{n} - b_2 \frac{n^2}{12} \quad \left( = B_0 \frac{1}{n} - b_2 \frac{n^2}{12} \right)$$

When $x=n/2 \cos \omega$, where $\omega=2\pi f$ and f=frequency, the coefficients of the polynomial become:

$$\left( b_0 + b_2 \frac{n^2}{8} \right) + \left( b_1 \frac{n}{2} + b_3 \frac{3n^3}{32} \right) \cos\omega + \left( b_2 \frac{n^2}{8} \right) \cos 2\omega + \left( b_3 \frac{n^3}{32} \right) \cos 3\omega$$

The coefficient of cos ω is the gain at the frequency of an input sine wave. The coefficients of cos 2ω and cos 3ω are the levels of second and third harmonic distortion, respectively. The first term is the DC offset when the sine wave is present. Digital signatures for the test parameters which are meaningful and easy to calculate (e.g. at high speed, on-chip) are:

$$B_0 = (S_3 + S_2) + (S_1 + S_0) \approx n \cdot \text{offset},$$

$$B_1 = (S_3 + S_2) - (S_1 + S_0) \approx \frac{n}{2} \cdot \text{gain},$$

$$B_2 = (S_3 - S_2) - (S_1 - S_0) \approx \frac{n}{2} \cdot \text{2nd harmonic, and}$$

$$B_3 = 2(S_3 - S_2) + 2(S_1 - S_0) - B_1 \approx \frac{3n}{4} \cdot \text{3rd harmonic}.$$

To reduce the accumulator size, instead of summing y, one can sum $Y_{error}$ (=y−x) and add 1 to the value for $b_1$. Note also that since $n=2^N$, dividing by n is a simple binary shift right.

Thus these four parameters are easily calculated using a small number of additions, subtractions, binary shifts, and the four areas $S_0$, $S_1$, $S_2$, $S_3$, (sums) under the transfer function of FIG. 5.

Figure 6:
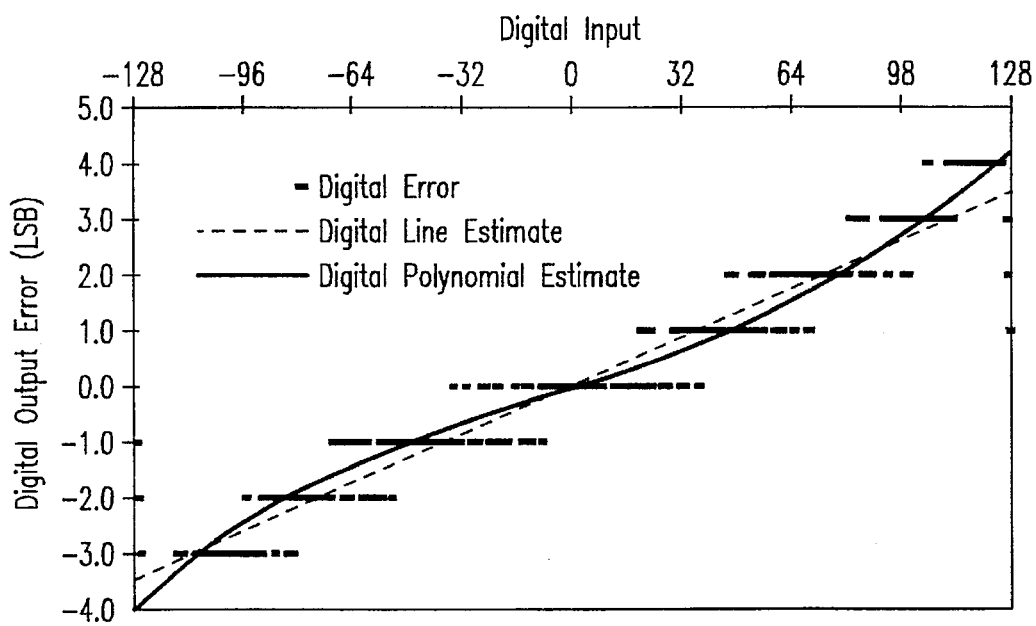
FIG. 6 shows an example of a polynomial curve fitted to the output data points magnified by plotting the error (difference) between each data point and its ideal value.

FIG. 6 depicts a best fit polynomial (solid line) calculated for a realistic set of data points with significant random noise; without the noise, the data points would create a simple staircase as in FIG. 5. In FIG. 6, the digital output error is plotted with respect to unity gain, in LSB (vertical axis) vs. 256 digital input points (between −128 and 128) on the horizontal axis. The solid line is the digital polynomial estimate (best fit) while the broken line is the digital line estimate; the horizontal short lines indicate digital error.

BIST Implementation

While one embodiment of the present invention is in the context of built in self test (BIST) which is on-chip circuitry, that is not limiting; for instance the circuitry may all or partly be present off chip.

However, in accordance with the present invention, the test circuitry may be economically implemented entirely on-chip in the logic BIST controller 40 in FIG. 3 and the associated multiplexer 34 and demultiplexer 36.

In one embodiment the actual value limits for each of the parameters to be tested are loaded by the chip designer into registers provided in the BIST controller 44. That is, the chip designer selects the actual desired ranges for e.g. the offset, the gain and the linearity. The on-chip test circuitry then determines if each of the test parameter ranges is met and provides as an output signal a simple pass or fail indicator for each parameter. This requires virtually no off chip testing circuitry.

In one commercial version, the BIST circuitry is supplied to the chip designer in the form of a high level logic description, i.e. VHDL code describing the logic circuitry to implement BIST controller 44, as described above. Of course this is not the only form in which the invention may be embodied; the required test circuitry may be designed at the logic gate level, or the resources necessary to carry out the on-chip testing in accordance with this invention may be already present on the chip and used in a non-test (operational) mode for other purposes.

Figure 7:
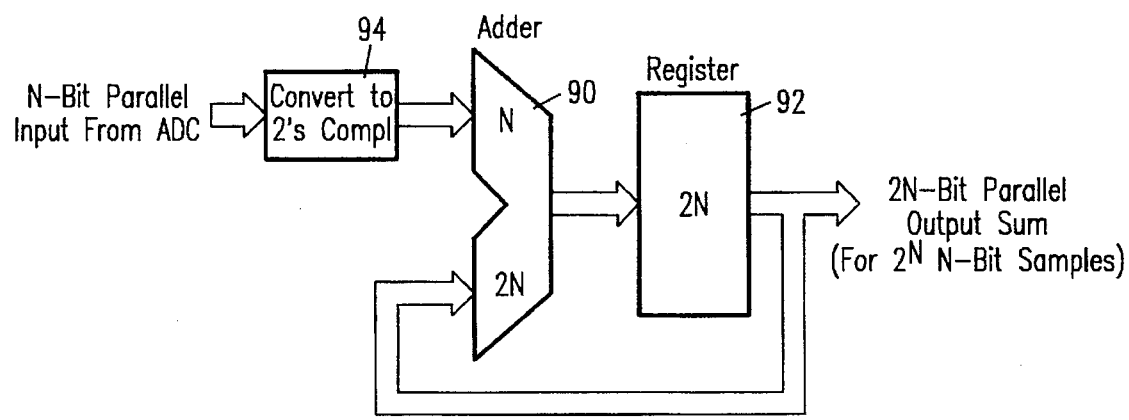
FIG. 7 shows a typical accumulator used in accordance with this invention.

In an economical embodiment suitable for high speed, the logic BIST controller 40 of FIG. 3 represents only four 2N-bit registers, a 2N-bit accumulator, an N-bit counter, and about fifty gates of random logic. The additions, subtractions, shifts, and comparisons with test limits are rapidly performed by an arithmetic logic unit (ALU) present in other circuitry coincidentally present on-chip, or in another IC on the same circuit board, or in a low cost tester which has no DSP capabilities. An accumulator (integrator) as shown in FIG. 7 is typically implemented with an N-bit parallel adder 90 (or a 1-bit serial adder) requiring N clock cycles, connected to a 2N-bit register 92. An N-bit parallel input signal from ADC 14 of FIG. 3 is converted to its two's complement by converter 94 before being input to adder 90. The Output signal from register 92 is a 2N-bit parallel bit sum, for $2^N$ N-bit samples.

Alternatively, when the output is subtracted from the input, an N-bit subtractor, an N-bit (or less) accumulator, and four N-bit (or less) registers are used. In this case, the number of register bits is also dependent on the expected offset, gain, and non-linearity.

Another way to achieve faster or more economical testing in accordance with this invention is to use a value for n which is less than the maximum possible, e.g. for a 12-bit DAC and ADC, the maximum value for n is $2^{12}$=4096; however accuracy is approximately equal to ½n, therefore n=256 is sufficient to achieve ±0.2% accuracy. This can be achieved by only testing the center portion of the entire range, or by testing every sixteenth value, or by some combination of the two approaches.

The BIST controller 40 includes a test pattern generator to generate test vectors. The test pattern generator is a conventional binary counter, or a combination of binary counter for the most significant bits and an LFSR for the least significant bits. The generator may alternatively be a combination of the above circuits and an alternating sign bit (assuming that the mean value is assigned a value of zero); this method delivers a modulated waveform. The following are exemplary test patterns for a 3-bit counter test pattern generator (the underscoring showing beginning of the pattern):

a) conventional 3-bit binary counter:
0,1,2,3,4,5,6,7,0,1,2,3,4,5,6,7,0,1, . . .

b) conventional 2-bit binary magnitude + sign:
−3,−2,−1,0,1,2,3,−3,−2,−1,0,1,2,3,−3,−2, . . .

c) 2-bit binary magnitude with alternating sign bit:
−3,3,−2,2,−1,1,0,0,−3,3,−2,2,−1,1,0,0,−3,3,−2, . . .

In sequence (a), the mean value is greater than zero; this sequence is only suitable for testing analog circuits that pass DC voltages. In sequence (b), the overall mean value is zero, but for any interval not containing an integer multiple of 8 values, the mean is not zero. This prevents using this sequence to test many (but not all) analog circuits which do not pass DC voltages. In sequence (c), the alternating sign bit produces a sequence that has zero mean for any even number of values (starting with the first value), and hence has no DC component, and is thus suitable for band-pass or high-pass filters. Sequence (c) is also suitable for measuring gain of any analog network at one specific frequency, i.e. at the sample clock frequency divided by two.

It is necessary to account (compensate) for arbitrary delay in the analog circuits connected between the DAC 20 and ADC 14 in FIG. 3. To accomplish this, one embodiment of the present invention includes adaptive delay compensation, described hereinafter.

First, a simple pattern of two alternating input values is applied to the DAC 20, e.g. the minimum and maximum values. The output signal from the ADC 14 is then subtracted from the test pattern to the DAC 20 once per sample clock period, for two periods, and the average absolute error is saved in a register. Next, the delay prior to the comparison with the ADC output signal is increased, in increments of less than one sampling clock period, for example in increments of one quarter of the clock period. Each time the delay is increased, two more values are sampled and the average absolute error is compared with the previous value in the register. This is continued until a minimum average absolute error is achieved. At this time point, the delay compensation mode is changed.

Next, the planned test pattern is applied to DAC 20, for example a modulated count, and again the digital delay is increased, starting with the delay determined in the first step, but in increments of one sampling clock period, until a minimum average absolute error is achieved. At this point the digital delay that has been inserted between the modulator counter and the ADC output is equal to the delay of the DAC, analog circuit, and the ADC. At this time, the required sums are accumulated to determine offset, gain, and non-linearity.

The delay circuit may be in one embodiment an N-bit first-in first-out (FIFO) register, but that typically requires many register memory bits. A more economical circuit includes a second test pattern generator, identical to the test pattern generator used to provide the test pattern to the DAC, and delays the initialization of this second test pattern generator relative to the initialization of the first test pattern generator. Such a delay is provided by e.g. a simple binary counter and combinational logic.

Differential Non-Linearity (DNL)

DNS, in accordance with this invention, is determined by applying a digital test pattern to the DAC, supplied by a simple binary counter, and accumulating consecutive digital output signal samples from the ADC, as previously described for testing other non-linearities. For DNL however, one need only accumulate m samples, where m is a small number, e.g. m=3 (and m≦n/2). As each new output value is sampled, it is compared to the average of the previous m sample differences; the difference between the average and the new sample value is equal to $b_1(m+1)/2+$ DNL, for that particular input value. For m=3, and gain $(b_1)=1$, the expected value is equal to the average plus two. Any excess error is DNL; typically ±1 LSB DNL is tolerated.

Next a new average is calculated which includes the latest sample and the previous m-1 samples. This is repeated for all n samples, and typically the largest value for DNL is retained and compared to a test limit.

Variations on this are possible. DNL near to the overall mean output value is often more significant than DNL near the extreme output values, because the former affects smaller amplitude signals as well as large, whereas the latter affects only larger amplitude signals. For this reason, a higher weighting may be attributed to excess DNL in the region around the mean. Also, when gain is greater than unity or there is offset, and the full range of input (test pattern) values is being tested, the maximum and minimum output signals of the DAC may be outside the range of the ADC and cause DNL to be falsely detected. For this reason, DNL for the minimum and maximum input values may be assigned a very small weighting, or even ignored. A further simplification is to determine only the number of instances when a DNL limit is exceeded.

As described for determination of the polynomial coefficients, DNL is also determined by storing the difference between the digital input (test pattern) to the DAC and the digital output signal from the ADC, so that a smaller accumulator can be used. In this case, the expected difference between the average difference and the difference for the m+1 sample is $(b_1-1)(m+1)/2+$DNL. Clearly, when $b_1=1$, any change in the difference is equal to the DNL.

In the prior art, no averaging is used, or only the ideal value is used (i.e. zero). The present method is better than no averaging because it is more noise tolerant; it is better than comparing to zero because offset and gain errors can be tolerated. For example, a 3-bit offset is recorded as DNL of 3 LSB in the prior art, unless FFT techniques are used. The present method cancels any offset before measuring DNL.

This disclosure is illustrative and not limiting; further modifications will be apparent to one skilled in the art in light of this disclosure and are intended to fall within the scope of the appended claims. For instance, in one embodiment no ADC is present in a circuit otherwise arranged as in of FIG. 3, and the summing of output sample signals from the analog circuits is performed directly by an additional analog circuit, e.g. an integrator having its input terminal connected to an output terminal of the analog circuits under test and providing the integrated signal as the output signal. In another embodiment no DAC is present, and an analog test pattern is generated directly by an analog circuit, e.g. a ramp generator and applied to the analog circuits to be tested, with the ADC receiving the output signals from the analog circuits. In yet another embodiment, the mixed signal system includes connected in order an ADC, a digital circuit having its input terminals connected to the output terminal of the ADC, and a DAC having its input terminals connected to the output terminals of the digital circuit. An analog test pattern is applied to the input terminals of the ADC, and the resulting analog signal output from the DAC is integrated using analog circuitry (e.g. an integrator) to generate the sums.

We claim:

1. A method for testing a mixed signal system having an interconnected digital to analog converter (DAC), an analog circuit, and an analog to digital converter (ADC), the method comprising the steps of:

connecting an output terminal of the DAC to an input terminal of the analog circuit and an output terminal of the analog circuit to an input terminal of the ADC;

applying a test pattern having a plurality of sequential values to the DAC;

obtaining an output signal from the ADC, at each of a plurality of times, resulting from the application of the test pattern;

determining a sum of the output signals for each of p groups of samples, where p equals two or four and also equals the number of terms in a polynomial which best fits a transfer function of the mixed signal system; and calculating from the sums at least one of a gain, a non-linearity, and coefficients of the polynomial.

2. The method of claim 1, wherein there are n unique test pattern values and the step of calculating includes determining the gain by the steps:

considering the n test pattern values to be sorted from lowest value to highest value, with the first n/2 values in a first set and the remaining n/2 values in a second set;

calculating a sum of the output signals within each of the first and second sets of n/2 values; and calculating the gain as a function of a difference between the two sums.

3. The method of claim 1, wherein there are n unique test pattern values and the step of calculating includes determining a second order and higher order non-linearity by the steps of:

considering the n test pattern values to be sorted from lowest value to highest value, with the first n/4 values in a first set, and each subsequent n/4 values in each of three other sets;

calculating a sum of the output signals within each of the four sets of n/4 values; and calculating the non-linearity as a function of the four sums.

4. The method of claim 1, wherein there are n unique test pattern values and the step of calculating includes determining a differential non-linearity (DNL) by the steps of:

(a) considering the n test pattern values to be sorted from lowest value to highest value;

(b) considering a first m consecutive test pattern values, where m is less than or equal to n/2;

(c) calculating an average output signal value for the m test pattern values;

(d) calculating the DNL as a function of the m+1 value and the average value calculated for the m preceding values;

(e) repeating steps a, b, c, and d for each subsequent output signal value of the sorted values, and at each repetition comparing the output sample value to the average value for the preceding m output values; and (f) calculating an overall DNL as a function of a maximum calculated DNL.

5. The method of claim 1, wherein there are n unique test pattern values and the step of calculating includes determining the gain by the steps of:

considering the n test pattern values to be sorted from lowest value to highest value, with the first n/2 values in a first set and the remaining values in a second set;

calculating a difference between each output signal value and an associated test pattern value;

calculating a sum of the calculated differences for each of the first and second sets of n/2 values; and calculating the gain as an error relative to unity as a function of a difference between the sum for the first set and the sum for the second set.

6. The method of claim 1, wherein there are n unique test pattern values and the step of calculating includes determining a second order and higher order non-linearity by the steps of:

considering the n test pattern values to be sorted from lowest value to highest value, with a first n/4 values in one set, and an equal number of values in each of three other sets;

calculating a difference between each output signal value and an associated test pattern value;

calculating a sum of the differences for each of the four sets of n/4 values; and calculating the non-linearity as a function of the sums for the four sets.

7. The method of claim 1, wherein the test pattern applied to the DAC is one selected from a group consisting of:

a linear ramp, generated by continually incrementing a binary counter;

a linear ramp, generated by continually decrementing a binary counter;

a pseudo random linear ramp, generated by using a linear feedback shift register (LFSR) for the least significant bits of the DAC and a binary counter for the most significant bits; and a modulated linear ramp, generated by a binary counter for all bits except the sign bit (SB), and alternating the SB, or all bits if there is no SB, within each count from the counter to produce an analog test pattern at the output of the DAC whose average value for every consecutive pair of output values is equal to the overall mean value.

8. The method of claim 1, wherein a delay introduced by any of the DAC, the analog circuit, and the ADC is compensated for by adaptively delaying transmission of the test pattern to the DAC by the steps of:

first, applying a test pattern of two alternating input values to the DAC, and increasing a delay prior to a comparison with the ADC output signal, in increments of less than one sampling clock period, from zero until a minimum average absolute error is achieved;

second, applying the test pattern, and increasing the delay from the delay determined in the first step, in increments of one sampling clock period, until a minimum average absolute error is achieved; and third, accumulating the sums to determine at least one of an offset, a gain, and a non-linearity.

9. The method of claim 1, wherein the test pattern is generated by a first test pattern generator, and further comprising introducing a delay to compensate for delay of the DAC, analog circuit, or ADC by the steps of:

providing a second test pattern generator;

using a test pattern from the second test pattern generator for comparison to the ADC output signal; and delaying initialization of the second test pattern generator relative to an initialization of the first test pattern generator.

10. The method of claim 1, wherein there are n unique test pattern values and the step of calculating includes determining a differential non-linearity (DNL) by the steps of:

(a) considering the n test pattern values to be sorted from lowest value to highest value;

(b) considering a first m consecutive test pattern values, where m is less than or equal to n/2;

(c) calculating, for the m test pattern values, an average difference between the output signal values and associated test pattern values;

(d) calculating the DNL as a function of an m+1 difference and an average difference calculated for the m preceding values;

(e) repeating steps a, b, c, and d for each subsequent output signal value in the n sorted test pattern values, for each repetition comparing a difference between the output signal value and the test pattern value to an average difference for the preceding m output values; and (f) calculating an overall DNL as a function of a maximum calculated DNL measured.

11. The method of claim 1, wherein the ADC, DAC, and analog circuit are not all on a single integrated circuit.

12. The method of claim 1, wherein the ADC, DAC, and analog circuit are elements of a digital signal processor.

13. The method of claim 1, wherein the test pattern sequential values are uniformly spaced apart in time.

14. The method of claim 1, wherein at least two times at which the sums of the output signals are obtained are time intervals of uniform duration.

15. The method of claim 7, wherein the test pattern is suitable for testing the gain and nonlinearity at a frequency equal to one half a clock frequency of the DAC.

16. The method of claim 10, wherein a weighting inversely proportional to the difference between the output signal value and an overall mean output signal value accounts for a greater effect by the DNL on a signal to noise ratio of smaller amplitude signals than on larger amplitude signals.

17. A test structure for a mixed signal system having an interconnected digital to analog converter, an analog circuit, and an analog to digital converter (ADC), the test structure comprising:

a demultiplexer selectively connecting an output terminal of the DAC to an input terminal of the analog circuit;

a multiplexer selectively connecting an output terminal of the analog circuit to an input terminal of the ADC;

a test pattern generator connected to an input terminal of the DAC and generating a test pattern having a plurality of sequential values; and a test controller having an input terminal connected to an output terminal of the ADC, thereby receiving an output signal from the ADC resulting from application of the test pattern to the DAC, wherein the test controller determines a sum of the output signal over at least two sets of unique input values.

18. The structure of claim 17, wherein the test controller further includes means for calculating at least one of a gain and a non-linearity from the sums.

19. A method for testing a mixed signal system having an interconnected digital to analog converter (DAC), and an analog circuit, the method comprising the steps of:

connecting an output terminal of the DAC to an input terminal of the analog circuit;

applying a test pattern having a plurality of sequential values to the DAC;

obtaining an output signal from the analog circuit, at each of a plurality of times, resulting from the application of the test pattern;

integrating the output signals for each of at least two sets of unique test pattern input values; and calculating from the integrated output signals at least one of a gain and a non-linearity of the mixed signal system.

20. A method for testing a mixed signal system having an interconnected ramp generator, an analog circuit, and an analog to digital converter (ADC), the method comprising the steps of:

connecting an output terminal of the ramp generator to an input terminal of the analog circuit, and an output terminal of the analog circuit to an input terminal of the ADC;

applying a test pattern having a plurality of sequential values generated by the ramp generator to the analog circuit;

obtaining an output signal from the ADC, at each of a plurality of times, resulting from the application of the test pattern;

determining a sum of the output signals for at least two sets of unique test pattern input values; and calculating from the sums at least one of a gain and a non-linearity of the mixed signal system.

21. A method for testing a mixed signal system having an interconnected analog to digital converter (ADC), a digital circuit, and a digital to analog converter (DAC), the method comprising the steps of:

connecting an output terminal of the ADC to an input terminal of the digital circuit, and an output terminal of the digital circuit to an input terminal of the DAC;

applying a test pattern having a plurality of sequential values to the ADC;

obtaining an output signal from the DAC, at each of a plurality of time intervals, resulting from the application of the test pattern;

integrating the output signals for each of at least two sets of unique test pattern input values; and calculating from the integrated output signals at least one of a gain and a non-linearity of the mixed signal system.

22. A computer-implemented system for testing of analog to digital converters or digital to analog converters by calculating the coefficients of a best-fit polynomial for a set of data points expressed in x-axis and y-axis coordinates to determine test parameters of the converters, the system comprising:

means for summing the y-axis data point values for each of at least two sets of unique x-axis data point values wherein the x-axis and y-axis data point values respectively represent test input and corresponding test output values; and means for calculating from the sums at least one of the coefficients, except the zeroeth order coefficient.

23. A computer-readable memory encoded with program instructions for calculating the coefficients of a best-fit polynomial for a set of data points expressed in x-axis and y-axis coordinates, the program instructions including:

summing the y-axis data point values for each of at least two sets of unique x-axis data point values; and calculating from the sums at least one of the coefficients, except the zeroeth order coefficient.

* * * * *